United States Patent
Hsu et al.

(10) Patent No.: US 8,877,409 B2
(45) Date of Patent: Nov. 4, 2014

(54) REFLECTIVE MASK AND METHOD OF MAKING SAME

(75) Inventors: Pei-Cheng Hsu, Taipei (TW);
Chih-Tsung Shih, Hsinchu (TW);
Chia-Jen Chen, Jhudong Township, Hsinchu County (TW); Tsiao-Chen Wu, Jhudong Township, Hsinchu County (TW); Shinn-Sheng Yu, Hsinchu (TW);
Hsin-Chang Lee, Hsin-Chu Xian (TW);
Anthony Yen, Zhubei (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 147 days.

(21) Appl. No.: 13/451,705

(22) Filed: Apr. 20, 2012

(65) Prior Publication Data
US 2013/0280643 A1     Oct. 24, 2013

(51) Int. Cl.
*G03F 1/24*     (2012.01)

(52) U.S. Cl.
CPC .................................. *G03F 1/24* (2013.01)
USPC .............................................................. 430/5

(58) Field of Classification Search
CPC ...................................................... G03F 1/24
USPC ............................................................ 430/5
See application file for complete search history.

(56) References Cited

U.S. PATENT DOCUMENTS

| | | | | |
|---|---|---|---|---|
| 5,328,784 A | * | 7/1994 | Fukuda | 430/5 |
| 2002/0192571 A1 | * | 12/2002 | Schwarzl | 430/5 |
| 2004/0131947 A1 | * | 7/2004 | Fisch Gallagher et al. | 430/5 |
| 2009/0220869 A1 | * | 9/2009 | Takai | 430/5 |

OTHER PUBLICATIONS

Kamo, Takashi, et al., "Light-shield border impact on the printability of extreme-ultraviolet mask," Journal of Micro/Nanolithography, MEMS, and MOEMS, SPIEDigitalLibrary.org/jm3, 10(2), 023001, Apr.-Jun. 2011, 9 pages.
Hyun, Yoonsuk, et al., "Feasibility of EUVL thin absorber mask for minimization of mask shadowing effect," Proc. of SPIE vol. 7636, 763614, 2010 SPIE, 11 pages.

* cited by examiner

*Primary Examiner* — Mark F Huff
*Assistant Examiner* — John S Ruggles
(74) *Attorney, Agent, or Firm* — Haynes and Boone, LLP

(57) ABSTRACT

A reflective mask is described. The mask includes a low thermal expansion material (LTEM) substrate, a conductive layer deposited on a first surface of the LTEM substrate, a stack of reflective multilayers (ML) deposited on a second surface of the LTEM substrate, a capping layer deposited on the stack of reflective ML, a first absorption layer deposited on the first capping layer, a main pattern, and a border ditch. The border ditch reaches to the capping layer, a second absorption layer deposited inside the border ditch, and the second absorption layer contacts the capping layer. In some instances, the border ditch crosses the capping layer and partially enters the reflective multilayer.

20 Claims, 4 Drawing Sheets

REFLECTIVE MASK AND METHOD OF MAKING SAME

BACKGROUND

The semiconductor integrated circuit (IC) industry has experienced exponential growth. Technological advances in IC materials and design have produced generations of ICs where each generation has smaller and more complex circuits than the previous generation. In the course of IC evolution, functional density (i.e., the number of interconnected devices per chip area) has generally increased while geometry size (i.e., the smallest component (or line) that can be created using a fabrication process) has decreased. This scaling down process generally provides benefits by increasing production efficiency and lowering associated costs.

Such scaling down has also increased the complexity of processing and manufacturing ICs and, for these advances to be realized, similar developments in IC processing and manufacturing are needed. For example, an extreme ultraviolet lithography (EUVL) is implemented to meet a need of a higher resolution lithography process. In processes of fabricating an extreme ultraviolet (EUV) mask, reflectivity of a border on the EUV mask raises challenges to produce an IC pattern on a wafer substrate.

Accordingly, what is needed is a method that addresses the above issue and continues to improve the semiconductor manufacture process in a wafer fab. Also what is need is an improved mask, such as can be used in EUVL.

BRIEF DESCRIPTION OF THE DRAWINGS

The present disclosure is best understood from the following detailed description when read with accompanying figures. It is emphasized that, in accordance with the standard practice in the industry, various features are not drawn to scale and are used for illustration purpose only. In fact, the dimension of the various features may be arbitrarily increased or reduced for clarity of discussion.

DETAILED DESCRIPTION

Figure 1:
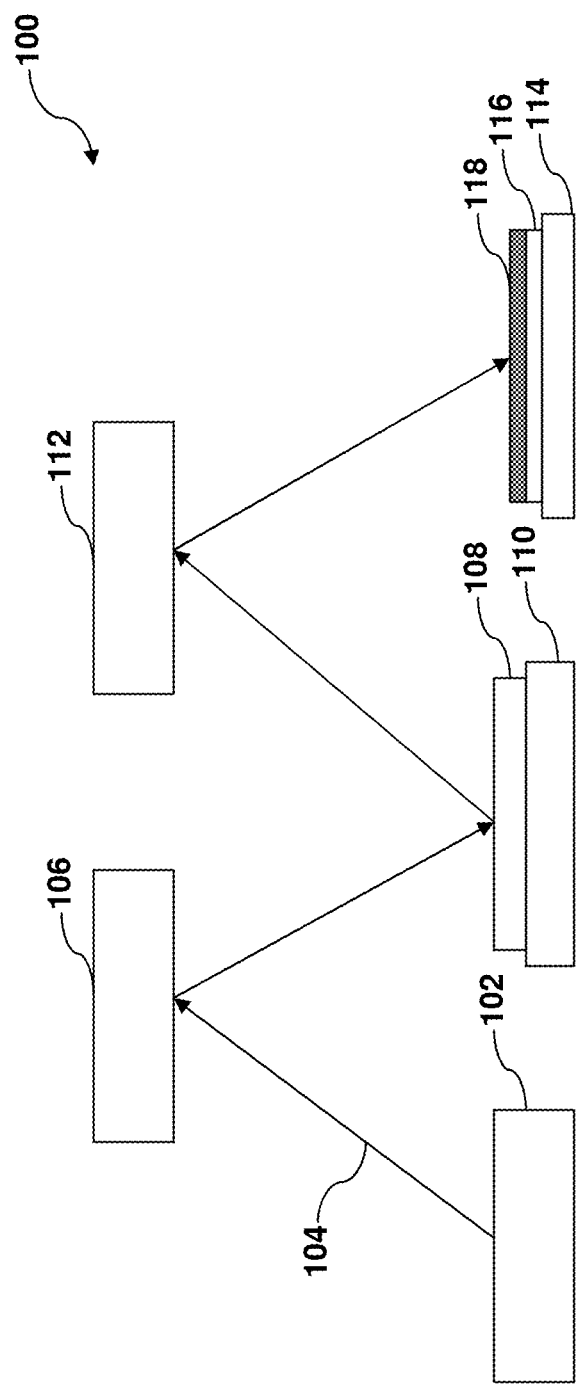
FIG. 1 represents a schematic diagram of an extreme ultraviolet (EUV) lithography system for implementing one or more embodiments of the present disclosure.

The following disclosure provides many different embodiments, or examples, for implementing different features of the invention. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Referring now to FIG. 1, an extreme ultraviolet (EUV) lithography system 100 is an example of a system that can benefit for one or more embodiments of the present disclosure. The EUV lithography system 100 includes a radiation source 102, an illumination beam 104, condenser optics 106, a mask 108, a mask stage 110, projection optics 112, a substrate stage 114, a substrate 116 and a resist film 118. However, other configurations and inclusion or omission of the device may be possible. In the present disclosure, the system 100 is also referred as a stepper or a scanner; and the mask 108 is also referred to as a photomask, a photo mask, or a reticle.

In the present embodiment, the radiation source 102 includes a laser providing the illumination beam 104 having a wavelength in an EUV range. For example, a high-power neodymium-doped yttrium aluminum garnet (Nd-YAG) laser beam focused on a xenon gas, liquid, or solid target produces 30 to 45 eV plasma that emits an EUV illumination beam having a wavelength of approximately 13.4 nm. The condenser optics 106 includes a multilayer coated collector and a plurality of grazing mirrors and is configured to collect and shape the illumination beam 104 and provide a slit of the illumination beam 104 to the mask 108 secured by the mask stage 110. The mask 108 provides an aerial image from the mask 108 to the illumination beam 104. The mask 108 includes a transmissive mask or a reflective mask. In the present embodiments, the mask 108 is the reflective mask. The mask 108 is positioned on the mask stage 110. The mask stage 110 includes a plurality of motors, roller guides, and tables; secures the mask 108 on the mask stage 110 by vacuum; and provides the accurate position and movement of the mask 108 in X, Y and Z directions during alignment, focus, leveling and exposure operation in the EUV lithography system 100. The projection optical 112 include a magnification lens and a plurality of mirrors, providing a reduction of the aerial image of the mask 108 to the resist film 118 deposited on the substrate 116 secured by the substrate stage 114. The substrate stage 114 includes motors, roller guides, and tables; secures the substrate 116 by vacuum; and provides the accurate position and movement of the substrate 116 in X, Y and Z directions during alignment, focus, leveling and exposing operation in the EUV lithography system 100 so that the image of the mask 108 is transferred onto the substrate in a repetitive fashion (though other lithography methods are possible). The system 100, or portions thereof, may include additional items, such as a vacuum system and/or a cooling system.

Continuing with the present embodiments, the substrate 116 deposited with the resist film 118 is loaded on the substrate stage 114 for exposing by the aerial image of the mask 108. In the present disclosure, the resist is also referred to as a photo resist, a resist film or a photo resist film. The resist film 118 includes a positive tone resist and a negative tone resist. The substrate 116 includes a wafer substrate. The wafer substrate includes a silicon wafer. Alternatively or additionally, the wafer may includes another elementary semiconductor, such as germanium; a compound semiconductor including silicon carbide, gallium arsenic, gallium phosphide, indium phosphide, indium arsenide, and/or indium antimonide; an alloy semiconductor including SiGe, GaAsP, AlInAs, AlGaAs, GaInAs, GaInP, and/or GaInAsP. In yet another alternative, the wafer is a semiconductor on insulator (SOI). A plurality of conductive and non-conductive thin films may be deposited on the wafer. For example, the conductive thin films may include a metal such as aluminum (Al), Copper (Cu), tungsten (W), nickel (Ni), titanium (Ti), gold (Au), and platinum (Pt) and, thereof an alloy of the metals. The insulator film may include silicon oxide and silicon nitride. The blank mask substrate may include a low thermal expansion material such as quarts, silicon, silicon carbide, and silicon oxide-titanium oxide compound.

In the present embodiment, the mask 108 in the EUV lithograph system 100 shown in FIG. 1 includes a main pattern and a border. The main pattern is formed according to the IC design layout pattern by an electron beam writer. The mask includes an absorption layer (main pattern and border) that includes Cr, Ti, or Ta based material doped with B, N, and/or O, such as TaBN, TaN, and CrN. Extinction coefficients of these materials are around 0.05, which means a reflectivity of the border is about 3.7%. In the present embodiment shown in FIG. 1, the reflectivity of the border is lower than 0.3% to achieve the dark pattern zone and to avoid the neighboring die effect on a wafer. One example method for reducing the reflectivity of the border is receiving a mask blank with thicker absorber layer. Therefore, the neighboring die effect is reduced by using thicker absorber layer. One disadvantage of thicker absorber layer is that a feature bias between a horizontal dimension and a vertical dimension (H-V bias) is increased. An alternative example reducing the reflectivity of the border is etching the absorption layer of the border and a reflective multilayer under the absorption layer. One disadvantage of etching the reflective multilayer is that a flatness of the mask is changed thereafter by etching a whole stack of the reflective multilayer.

Figure 2:
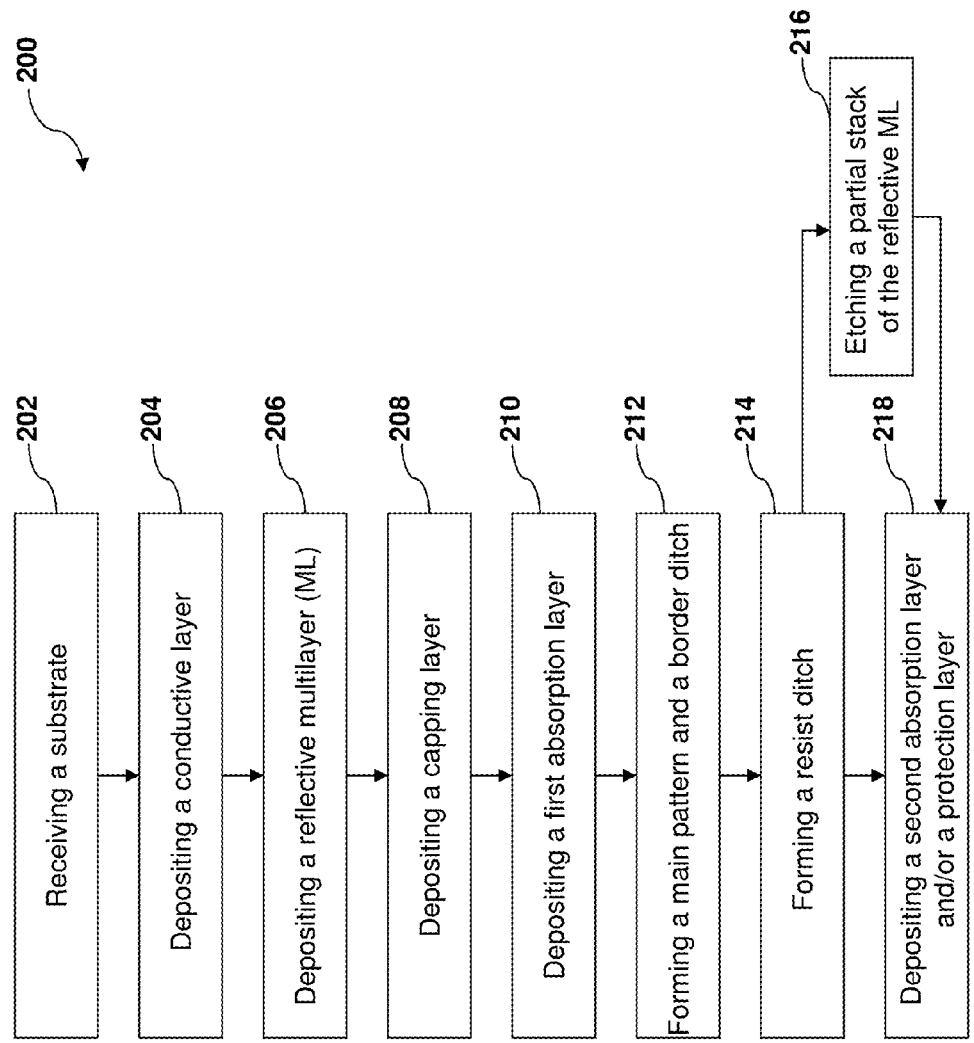
FIG. 2 is a flow chart of a method for forming a mask for implementing one or more embodiments of the present disclosure.

Referring now to FIG. 2, a method 200 can be used to form a mask for implementing one or more embodiments of the present disclosure. The method 200 begins at step 202 by providing or receiving a substrate. Then, the method 200 proceeds to step 204 by depositing a conductive layer on a first surface of the substrate. After step 204, the method 200 proceeds to step 206 by depositing a stack of a reflective multilayer (ML) on a second surface of the substrate. The method 200 further proceeds to step 208 by depositing a capping layer on the reflective ML. The method 200 proceeds to step 210 by depositing a first absorption layer on the reflective multilayer.

After step 210, the method 200 proceeds to step 212 by forming a main pattern and a ditch in a border area with the first absorption layer. The step 212 includes depositing a first resist film on the first absorption layer by a spin-on process, exposing the first resist film by an electron beam writer, and developing the exposed first resist film so that the first resist pattern is formed. The step 212 further includes performing an etching on the first resist pattern formed on the first absorption layer by a plasma dry etching or a wet etching process to form a main pattern and a border ditch with the first absorption layer. The step 212 also includes stripping the first resist film after the etching process and cleaning the surface for next step.

After step 212, the method 200 proceeds to step 214 for forming a resist ditch. The step 214 includes depositing a second resist film on the patterned first absorption layer by a spin-on process, exposing the second resist film by the laser beam writer, and developing the exposed second resist film so that the resist ditch is formed. The resist ditch only keeps the ditch open and protects the main pattern with the second resist film.

Continuing the present embodiments, after the step 214, the method 200 may proceed along two different routes. For example, the method 200 may proceed to step 216 for etching the capping layer and a partial stack of the reflective ML inside the ditch by a plasma dry etching or a wet etching process. After step 216, the method 200 proceeds to step 218 for depositing a second absorption layer into the ditch. The step 218 may include depositing a protection layer on the second absorption layer. The step 218 further includes stripping the second resist film by a lift off process, a wet cleaning process, and/or a plasma cleaning process.

As shown in FIG. 2, in another example, after the step 214, the method 200 may proceed to step 218 for depositing the second absorption layer into the ditch. The second absorption layer is deposited on the capping layer in the ditch. The step 218 may include depositing a protection layer on the second absorption layer. The step 218 further includes stripping the second resist film by a lift off process, a wet cleaning process, and/or a plasma cleaning process. Finally the mask is formed after step 218. In addition, the mask may be mounted with a pellicle by a pellicle frame. Additional steps can be provided before, during, and after the method 200, and some of the steps described can be replaced, eliminated, or moved around for additional embodiments of the method 200.

In the foregoing discussion, in the method 200, various layers, such as the conductive layer, the reflective ML, the first and second absorption layers, and the production layer, are deposited by a physical vapor deposition (PVD) process such as evaporation and DC magnetron sputtering, a plating process such as electrode-less plating or electroplating, a chemical vapor deposition (CVD) process such as atmospheric pressure CVD (APCVD), low pressure CVD (LPCVD), plasma enhanced CVD (PECVD), or high density plasma CVD (HDP CVD), ion beam deposition, spin-on coating, metal-organic decomposition (MOD), atomic layer deposition (ALD) and/or other methods known in the art. In the present embodiments, the etching process may include dry (plasma) etching, wet etching, and/or other etching methods. For example, a dry etching process may implement an oxygen-containing gas, a fluorine-containing gas (e.g., $CF_4$, $SF_6$, $CH_2F_2$, $CHF_3$, and/or $C_2F_6$), a chlorine-containing gas (e.g., $Cl_2$, $CHCl_3$, $CCl_4$, and/or $BCl_3$), a bromine-containing gas (e.g., HBr and/or $CHBR_3$), an iodine-containing gas, other suitable gases and/or plasmas, and/or combinations thereof.

Figure 3:
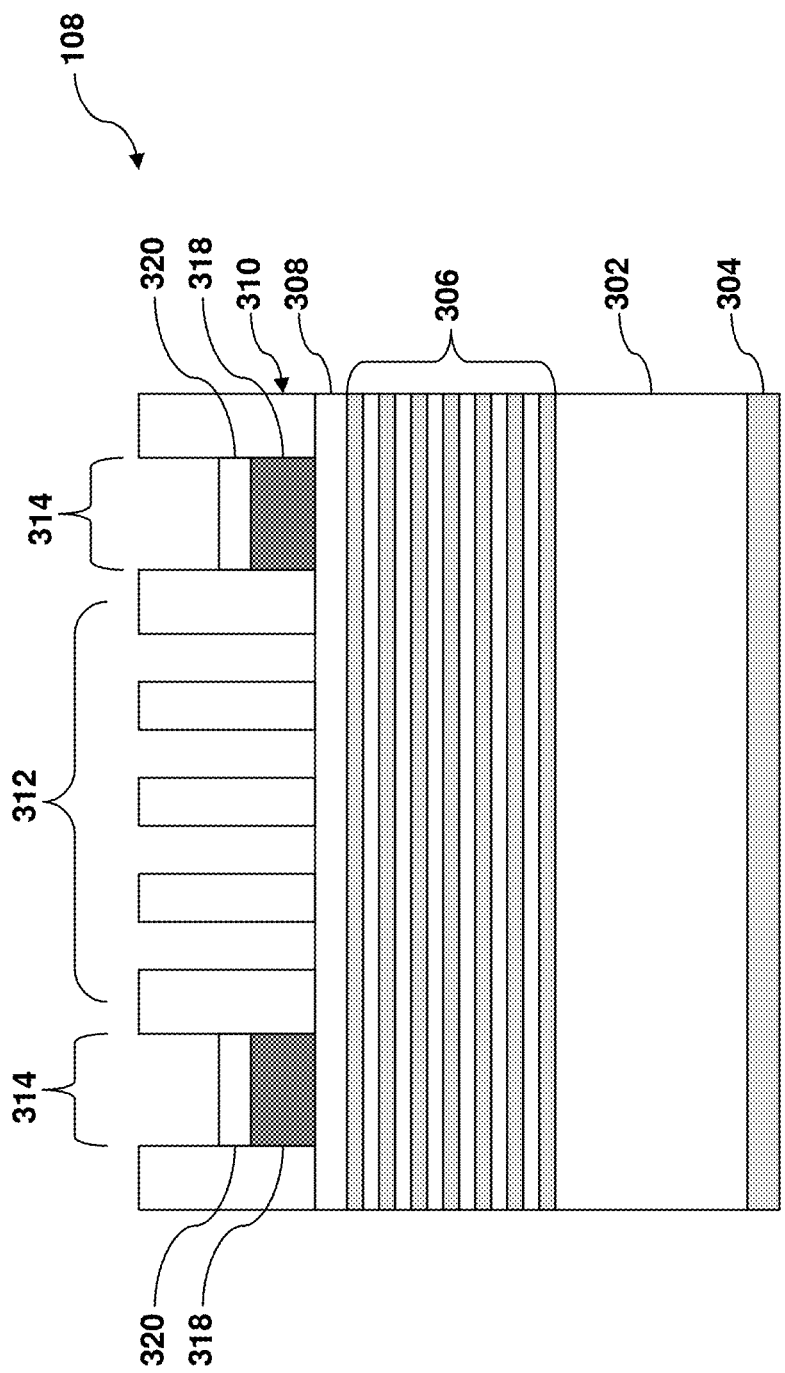
FIGS. 3-4 are diagrammatic cross-sectional side views of a mask according to one or more embodiments of the present disclosure
Figure 4:
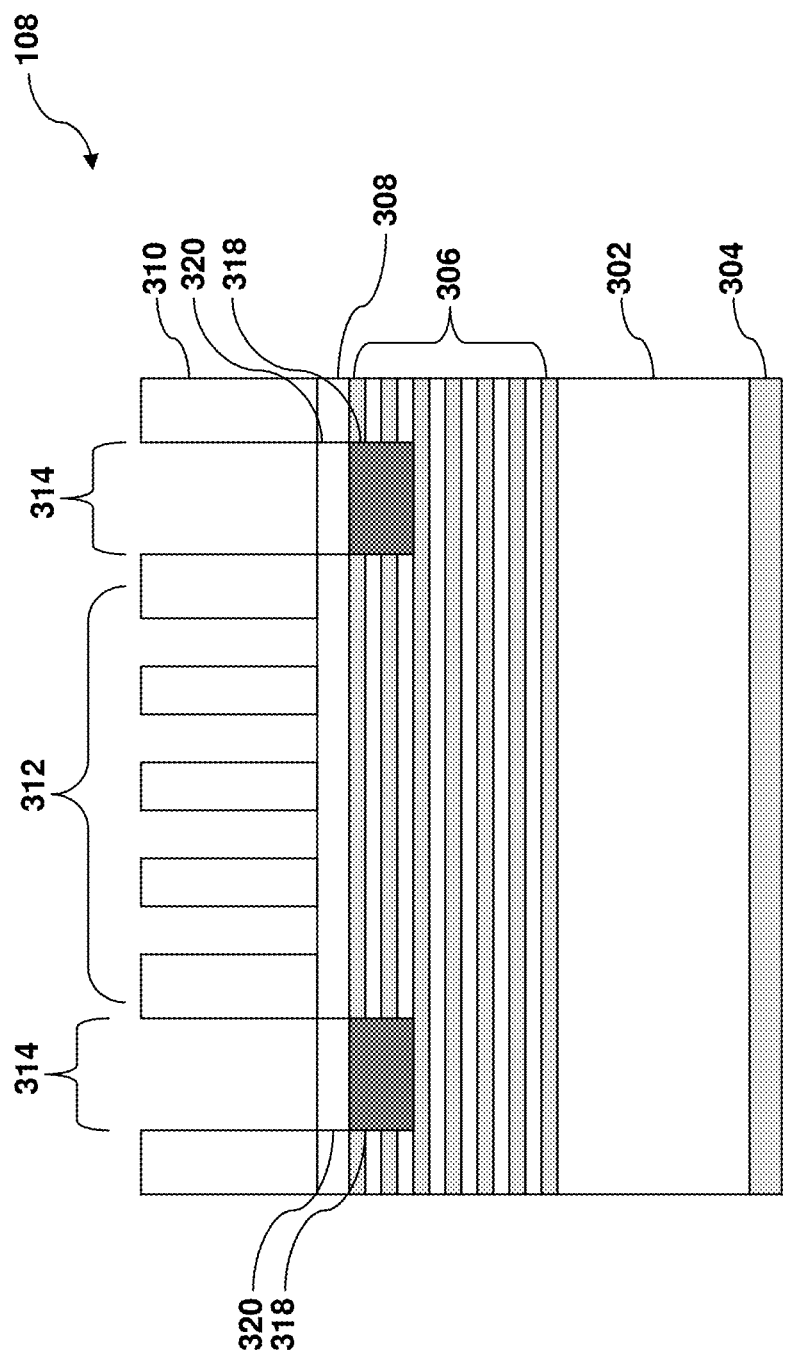

Referring to FIGS. 3-4, diagrammatic cross-sectional side views of a mask 108 are illustrated according to one or more embodiments of the present disclosure. The mask 108 includes a substrate 302, a conducting layer 304, a reflective multilayer (ML) 306, a capping layer 308, a first absorption layer 310, a main pattern 312, a border ditch 314, a second absorption layer 318, and a protection layer 320. However, other configurations and inclusion or omission of a device may be possible. The mask 108 is fabricated by the method 200 as shown in FIG. 2. For EUV lithography, the mask 108 includes a binary intensity mask (BIM) and a phase-shifting mask (PSM). For example, the BIM includes an almost totally absorptive region (also referring to as an opaque region) and a reflective region. In the opaque region, an absorber is present and an incident light beam is almost fully absorbed by the absorber. In the reflective region, the absorber is removed and the incident light is reflected by the reflective ML. In another example, a PSM includes an absorptive region and a reflective region. A portion of the incident light reflects from the absorptive region with a proper phase difference with respect to reflected light from the reflective region to enhance the resolution and imaging quality. The PSM can be attenuated PSM (alt. PSM) or alternating PSM (att. PSM). An att. PSM usually has 2%-15% of reflectivity from its absorber, while an alt. PSM usually has larger than 50% of reflectivity from its reflective region.

In the present embodiments, the substrate 302 may include low thermal expansion material (LTEM). The substrate 302 serves to minimize image distortion due to mask heating by the intensified illumination radiation. The LTEM may include fused silica, fused quartz, calcium fluoride (CaF$_2$), silicon carbide, silicon oxide-titanium oxide alloy and/or other suitable LTEM known in the art. The substrate 302 includes materials with a low defect level and a smooth surface. In one embodiment, the conductive layer 304 may be deposited on a first surface of the substrate 302 as shown in FIG. 3 for an electrostatic chucking purpose. In one embodiment, the conductive layer 304 includes chromium nitride (CrN), though other compositions are possible.

As shown in FIG. 3, the reflective ML 306 is deposited on a second surface of the substrate 302. According to Fresnel equations, light reflection occurs when light propagates across the interface between two materials of different refractive indices. The reflected light is larger when the difference of refractive indices is larger. To increase the reflected light, one may also increase the number of interfaces by deposing the reflective ML 306 of alternating materials and let light reflected from different interfaces interfere constructively by choosing appropriate thicknesses for each layer inside the reflective ML 306. However, the absorption of the employed materials for the reflective ML 306 limits the highest reflectivity that can be achieved. The reflective ML 306 includes a plurality of film pairs, such as molybdenum-silicon (Mo/Si) film pairs (e.g., a layer of molybdenum above or below a layer of silicon in each film pair). Alternatively, the reflective ML 306 may include molybdenum-beryllium (Mo/Be) film pairs, or any material that is highly reflective at EUV wavelengths can be utilized for the reflective ML 306. The thickness of each layer of the reflective ML 306 depends on the EUV wavelength and the incident angle. The thickness of the reflective ML 306 is adjusted to achieve a maximum constructive interference of the EUV light reflected at each interface and a minimum absorption of the EUV light by the reflective ML 306. The reflective ML 306 may be selected such that it provides a high reflectivity to a selected radiation type/wavelength. A typical number of film pairs are 20-80, however any number of film pairs is possible. In an embodiment, the reflective ML 306 includes forty pairs of layers of Mo/Si. Each Mo/Si film pair has a thickness of about 7 nm, with a total thickness of 280 nm, and thereby a reflectivity of about 70% is achieved.

A capping layer 308 is deposited on the reflective ML 306. Because the capping layer 308 has different etching characteristics from an absorption layer, the capping layer 308 provides as an etching stop layer in a subsequent patterning or a repairing process of the absorption layer, which will be described later, The capping layer 308 includes ruthenium (Ru) and Ru compounds such as ruthenium-boron (RuB) and ruthenium-silicon (RuSi).

A first absorption layer 310 is deposited on the capping layer 308 and then is patterned to form the main pattern 312 and the border ditch 314. In the present embodiment, the absorption layer 310 absorbs radiation in the EUV wavelength range projected onto the mask 108. The absorption layer 310 can include a single layer or multiple layers from a group of chromium (Cr), chromium oxide (CrO), titanium nitride (TiN), tantalum nitride (TaN), tantalum (Ta), titanium (Ti), or aluminum-copper (Al—Cu), palladium, tantalum boron nitride (TaBN), aluminum oxide (AlO), molybdenum (Mo), or other suitable materials. With a proper configuration of film layers, the absorption layer 310 will provide process flexibility in a subsequent etching process by different etch characteristics of each film.

In the present embodiment, for example as shown in FIG. 3, a border ditch 314 is provided, and extends to the capping layer 308. A second absorption layer 318 is deposited into the border ditch 314. A protection layer 320 may be also deposited into the border ditch 314, sitting on top of the second absorption layer 318. In another example as shown in FIG. 4, the border ditch 314 may cross the capping layer 308 and enter the partial stack of the reflective ML. The second absorption layer 318 is deposited into the border ditch 314 and the protection layer 320 may also be deposited into the ditch 314, sitting on top of the second absorption layer 318. The second absorption layer 318 includes a high absorbing material and reduces the light reflectivity, such as below 0.3%. The protection layer 320 may protect the second adsorption layer 318 from an oxidation of the high absorbing material when the mask is in cleaning process. Furthermore, some of the second absorption layer 318 materials have poor resistance to cleaning and the protection layer 320 can enhance the cleaning durability. In the present embodiment, the second absorption layer 318 includes high absorbing materials such as nickel (Ni), nickel phosphorus (NiP) and silver oxide (Ag$_x$O). The protection layer 320 may include tantalum (Ta), tantalum nitride (TaN) or tantalum boron nitride (TaBN).

Continuing with the present embodiments, in a first example, by depositing 46 nm of nickel film into the border as the second absorption layer, the light reflectivity is reduced to 0.03%. In second example, by depositing 46 nm of nickel phosphorus (NiP) into the border ditch, the light reflectivity is reduced to 0.01%. In third example, by depositing a multiple film including 10 nm of tantalum (Ta) and 75 nm of silver oxide (Ag$_x$O) into the border ditch of 85 nm partially etched in the reflective ML, the light reflectivity can be reduced to 0.05%. In forth example, by depositing the multiple film including 20 nm of nickel (Ni), 17.4 nm of tantalum (Ta) and 47.4 nm of silver oxide (Ag$_x$O) into the border ditch, the light reflectivity is reduced to 0.2%.

In FIG. 3, the resist ditch is formed in the border ditch 314 above the ML 306 and the capping layer 308. In FIG. 4, the capping layer 308 and ML 306 are etched to extend the border ditch, and then the resist ditch is formed.

Thus, an EUV mask is described in the present disclosure. The EUV mask includes a low thermal expansion material (LTEM) substrate, a conductive layer on a first surface of the LTEM substrate, a reflective multilayer (ML) on a second surface of the LTEM substrate, a capping layer on the reflective ML, and a first absorption layer on the capping layer. The EUV mask further includes a main pattern and a border ditch in the first absorption layer. The border ditch reaches to the capping layer. The EUV mask also includes a second absorption layer deposited into the border ditch and a protection layer deposited on the second absorption layer.

In one embodiment, an EUV mask is presented. The EUV mask includes a low thermal expansion material (LTEM) substrate, a conductive layer on a first surface of the LTEM substrate, a reflective multilayer (ML) on a second surface of the LTEM substrate, a capping layer on the reflective ML, and a first absorption layer on the capping layer. The EUV mask further includes a main pattern and a border ditch. The border ditch crosses the capping layer and enters a partial stack of the reflective ML. The EUV mask also includes a second absorption layer deposited into the border ditch and a protection layer deposited on the second absorption layer.

In another embodiment, a unique method for fabricating an EUV mask is described. The method include depositing a conductive layer on a first surface of a low thermal expansion material (LTEM) substrate, a reflective multilayer (ML) on a second surface of the LTEM substrate, a capping layer on the reflective ML, and a first absorption layer on the capping layer. The method forms a main pattern and a border ditch at the first absorption layer. The method further forms a resist ditch. The method also includes depositing a second absorption layer into the resist ditch and depositing a protection layer on the second absorption layer. A flatness of the EUV mask is not impacted without etching the full stack of the reflective ML on the mask.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A mask comprising:
   a low thermal expansion material (LTEM) substrate;
   a conductive layer deposited on a first surface of the LTEM substrate;
   a stack of reflective multilayers (ML) deposited on a second surface of the LTEM substrate;
   a capping layer deposited on the stack of reflective ML;
   a first absorption layer deposited on the capping layer;
   a main pattern and a border ditch, wherein the border ditch extends toward the LTEM substrate to the capping layer without extending beyond the capping layer towards the LTEM substrate; and
   a second absorption layer in the border ditch.

2. The mask of claim 1, further comprising a protection layer deposited on the second absorption layer, wherein the protection layer includes tantalum (Ta).

3. The mask of claim 1, wherein the LTEM substrate includes one of fused silica, fused quartz, calcium fluoride (CaF$_2$), silicon carbide, and silicon oxide-titanium oxide alloy.

4. The mask of claim 1, wherein the conductive layer includes chromium nitride (CrN).

5. The mask of claim 1, wherein the stack of reflective ML includes a plurality of molybdenum-silicon (Mo/Si) film pairs or a plurality of molybdenum-beryllium (Mo/Be) film pairs.

6. The mask of claim 1, wherein the capping layer includes a ruthenium-containing material.

7. The mask of claim 1, wherein the first absorption layer includes a single layer or multiple layers from a group consisting of chromium (Cr), chromium oxide (CrO), titanium nitride (TiN), tantalum nitride (TaN), tantalum (Ta), titanium (Ti), aluminum-copper (Al—Cu), palladium, tantalum boron nitride (TaBN), aluminum oxide (AlO), and molybdenum (Mo).

8. The mask of claim 1, wherein the second absorption layer, deposited inside the border ditch, contacts the capping layer.

9. The method of claim 1, wherein the second absorption layer includes one of nickel (Ni), nickel phosphorus (NiP), or silver oxide (Ag$_x$O).

10. An extreme ultraviolet (EUV) mask, the EUV mask comprising:
    a low thermal expansion material (LTEM) substrate;
    a conductive layer deposited on a first surface of the LTEM substrate;
    a stack of reflective multilayers (ML) deposited on a second surface of the LTEM substrate;
    a capping layer deposited on the stack of reflective ML;
    a first absorption layer deposited on the capping layer;
    a main pattern and a border ditch, wherein the border ditch crosses the capping layer and partially enters the stack of the reflective ML;
    a second absorption layer deposited in the border ditch;
    a protection layer disposed in the border ditch directly on the second absorption layer, wherein the protection layer does not cover the main pattern.

11. The EUV mask of claim 10, wherein the protection layer includes one of tantalum (Ta), tantalum nitride (TaN), or tantalum boron nitride (TaBN).

12. The mask of claim 10, wherein the second absorption layer, deposited inside the border ditch, contacts the stack of reflective ML.

13. A mask comprising:
    a substrate;
    a stack of reflective multilayers (ML) deposited on the substrate;
    a capping layer deposited on the stack of reflective ML;
    a first absorption layer deposited on the capping layer;
    a main pattern and a border ditch, wherein the border ditch reaches to the capping layer;
    a second absorption layer in the border ditch; and
    a protection layer disposed in the border ditch over the second absorption layer, wherein the protection layer does not cover the main pattern.

14. The mask of claim 13, wherein the protection layer includes tantalum (Ta).

15. The mask of claim 13, wherein the substrate is a low thermal expansion material (LTEM) substrate that includes one of fused silica, fused quartz, calcium fluoride (CaF$_2$), silicon carbide, and silicon oxide-titanium oxide alloy.

16. The mask of claim 13, further comprising a conductive layer deposited on the LTEM substrate.

17. The mask of claim 13, wherein the stack of reflective ML includes a plurality of molybdenum-silicon (Mo/Si) film pairs or a plurality of molybdenum-beryllium (Mo/Be) film pairs.

18. The mask of claim 13, wherein the capping layer includes a ruthenium-containing material.

19. The mask of claim 13, wherein the first absorption layer includes a single layer or multiple layers from a group consisting of chromium (Cr), chromium oxide (CrO), titanium nitride (TiN)), tantalum nitride (TaN), tantalum (Ta), titanium (Ti), aluminum-copper (Al—Cu), palladium, tantalum boron nitride (TaBN), aluminum oxide (AlO), and molybdenum (Mo).

20. The mask of claim 13, wherein the second absorption layer contacts the capping layer and includes one of nickel (Ni), nickel phosphorus (NiP), or silver oxide (Ag$_x$O).

* * * * *